US008099252B2

(12) United States Patent
Warren et al.

(10) Patent No.: US 8,099,252 B2
(45) Date of Patent: Jan. 17, 2012

(54) SELF-TEST POWER MANAGEMENT UNIT

(75) Inventors: Daniel Adam Warren, San Jose, CA (US); John Joseph Sullivan, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 491 days.

(21) Appl. No.: 12/369,539

(22) Filed: Feb. 11, 2009

(65) Prior Publication Data
US 2010/0204946 A1   Aug. 12, 2010

(51) Int. Cl.
*G06F 19/00* (2011.01)
(52) U.S. Cl. ...................................................... 702/108
(58) Field of Classification Search .................. 702/108
See application file for complete search history.

(56) References Cited

U.S. PATENT DOCUMENTS

| 4,546,472 | A | 10/1985 | Volk et al. |
| 6,957,161 | B2 | 10/2005 | Allen et al. |
| 2004/0095024 | A1* | 5/2004 | Okamoto et al. ............. 307/100 |

* cited by examiner

*Primary Examiner* — Tung S Lau
(74) *Attorney, Agent, or Firm* — Fletcher Yoder PC

(57) ABSTRACT

Systems and methods are disclosed for a self-testing power management unit (PMU) in an electronic device. Self-testing may enable the testing of PMU power supply outputs while reducing the need for test points to conserve circuit board real estate. In one embodiment, a PMU is placed in self-test mode, and a test controller may perform capacitance tests on each power supply output. Once the capacitance test has been performed on each power supply output, the PMU may be placed in normal operating mode, and voltage tests may be performed on each power rail. Once voltage tests have been performed on all power rails in the PMU, the self-test may be complete. In some embodiments, the test controller may communicate with a test multiplexer to select the power supply output for testing. Further, the measurements resulting from the capacitance and voltage tests may be converted to a digital signal through an analog-to-digital converter on the PMU.

20 Claims, 6 Drawing Sheets

SELF-TEST POWER MANAGEMENT UNIT

BACKGROUND OF THE INVENTION

1. Technical Field

The present disclosure relates generally to electronic devices, and, more particularly, to the testing of power management units in such devices.

2. Description of the Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices, such as computers, portable media players, and mobile phones, are often tested during manufacturing to ensure that the power management unit (PMU) is functioning and properly connected to the circuit board of the device. The proper functioning and connection of the PMU may enable the PMU to output power to different units of the electronic device. Functional tests on the PMU may indicate when a PMU power output is not properly functioning. For example, a PMU pin may not be properly soldered onto the circuit board, or one power supply output on the PMU may be shorted to another power supply output.

To enable such testing, the circuit board may be manufactured with test points, and tests may be performed by accessing these test points on the circuit board. However, test points and other testing circuitry may occupy a significant amount of circuit board real estate.

SUMMARY

Certain aspects of embodiments disclosed herein by way of example are summarized below. It should be understood that these aspects are presented merely to provide the reader with a brief summary of the various techniques disclosed and/or claimed herein might take and that these aspects are not intended to limit the scope of any technique disclosed and/or claimed herein. Indeed, any technique disclosed and/or claimed herein may encompass a variety of aspects that may not be set forth below.

In one embodiment, an electronic device is provided that includes a power management unit (PMU) capable of self-testing. A test controller on the PMU may test the power supply outputs of the PMU to measure the capacitance, voltage, and/or current at each power supply. The testing of individual power supplies may be controlled by the test controller through a test multiplexer, and the test results from each power supply may be measured by an analog-to-digital converter (ADC) on the PMU. The test controller may indicate when and if any test results from a power supply are abnormal.

In one implementation, the test controller may contain registers to store self-test software. The software may control the testing of individual power supplies by opening or closing a pulldown resistor connected to each power supply, and by controlling the current supplied to each power supply. The software may also be capable of analyzing the voltage measurements received from the ADC. The configuration of the PMU and the capabilities of the test controller may enable the elimination of some test points to conserve a significant amount of circuit board real estate.

BRIEF DESCRIPTION OF THE DRAWINGS

Advantages of the disclosed techniques may become apparent upon reading the following detailed description and upon reference to the drawings in which.

DETAILED DESCRIPTION OF SPECIFIC EMBODIMENTS

Figure 1:
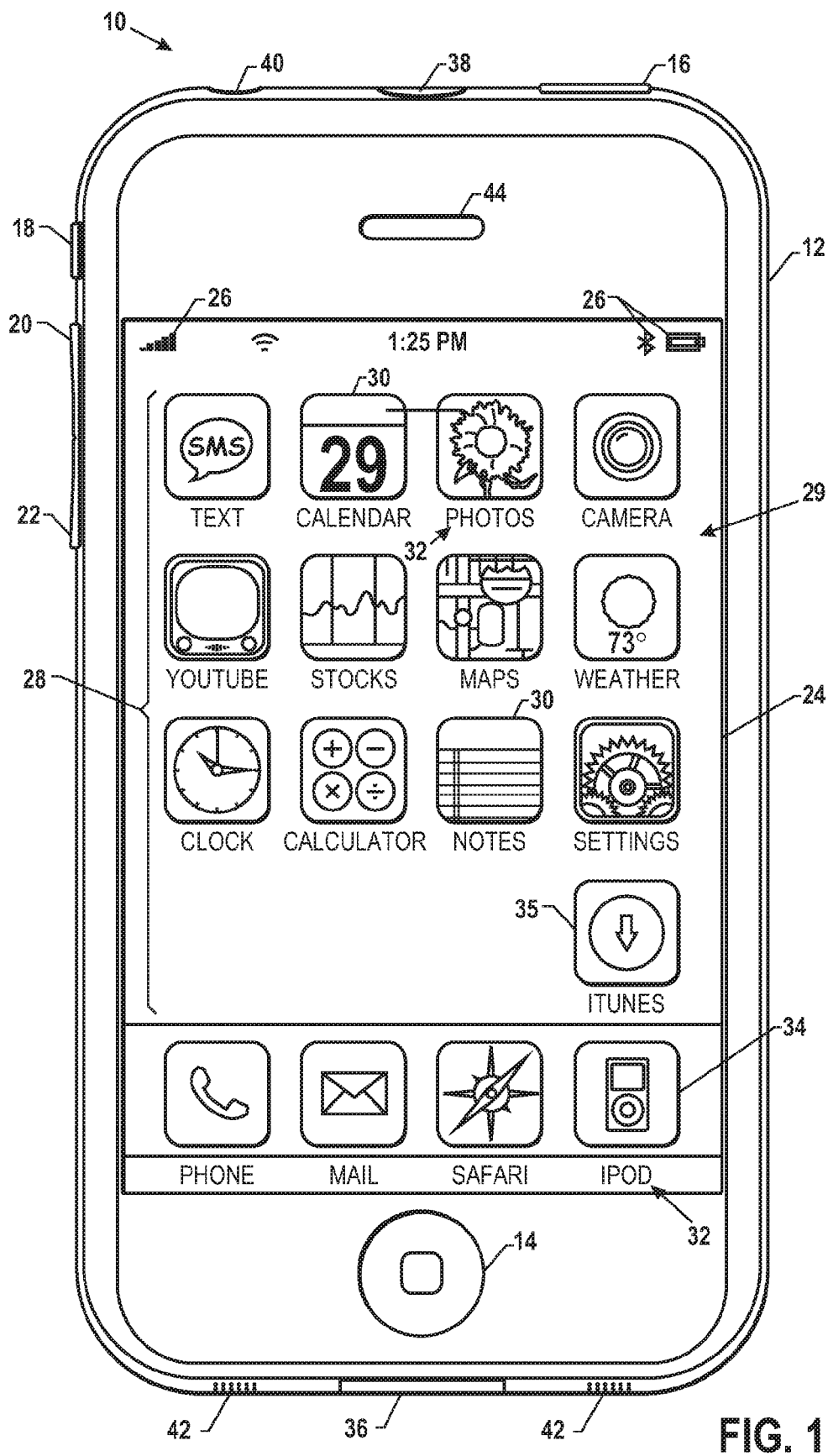
FIG. 1 is a perspective view illustrating a portable media player in accordance with one embodiment of the present techniques.

One or more specific embodiments of the present disclosure will be described below. These described embodiments are only exemplary of the presently disclosed techniques. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure generally provides methods and techniques for a power management unit ("PMU") to self-test. In certain embodiments, self-testing circuitry on a PMU may conduct functional tests, and may measure the capacitance, voltage, and/or current at each power supply output of the PMU. The measurements taken from each power supply output may be used to determine certain functional aspects of the PMU. For example, capacitance measurements may be used to determine whether the PMU is properly soldered on the printed circuit board ("PCB"), and voltage measurements may confirm the accuracy of the voltage supplied through a rail of each power supply output. In some embodiments, self-tests may be internal to the PMU, or substantially controlled from within the PMU. As functional testing may typically be conducted by using external testing devices or external testing circuitry to access test points on the PCB, a self-testing PMU may eliminate or reduce test points on the PCB. The reduction of test points may save space on the PCB, and may allow for size reductions of the electronic device.

Several of the terms used above may be used throughout the present disclosure, and definitions of such terms are provided to facilitate a better understanding of the present techniques. A PMU may include a microcontroller, and may contain memory, computer programs or instructions, and elements to carry out instructions. A PMU may control the supply of power to different units in an electronic device. For example, a PMU may direct the outputs from power supplies, referred to as "power supply outputs," to various elements on a device through "rails," or electrical connections between the power supply outputs and the device elements receiving power. The rails may connect power supply outputs of the PMU to a structure supporting and/or connecting elements of an electronic device, and may include, for example, a printed circuit board (PCB), or a flexible printed circuit board (FPC).

A "functional test" may refer to an evaluation of whether an electronic device or system is in compliance with certain requirements, including, for example, testing whether certain elements of a device are properly connected, or whether certain elements of a device are properly receiving power. A functional test may evaluate system compliance by comparing capacitance, voltage, and/or current measurements with known values. A "self-test" may refer to a functional test conducted without external control, or with reduced external control. For example, a self-test may be substantially controlled by units within an electronic device, such that the use of external testing devices, and access points for external testing devices, may be reduced.

Turning now to the drawings and referring initially to FIG. 1, a handheld processor-based electronic device that may include an application for playing media files is illustrated and generally referred to by reference numeral 10. While the techniques below are generally described with respect to media playback functions, it should be appreciated that various embodiments of the handheld device 10 may include a number of other functionalities, including those of a cell phone, a personal data organizer, or some combination thereof. Thus, depending on the functionalities provided by the electronic device 10, a user may listen to music, play games, take pictures, and place telephone calls, while moving freely with the device 10. In addition, the electronic device 10 may allow a user to connect to and communicate through the Internet or through other networks, such as local or wide area networks. For example, the electronic device 10 may allow a user to communicate using e-mail, text messaging, instant messaging, or other forms of electronic communication. The electronic device 10 also may communicate with other devices using short-range connection protocols, such as Bluetooth and near field communication (NFC).

By way of example only, the electronic device 10 may be a model of an iPod® or an iPhone®, available from Apple Inc. of Cupertino, Calif. Furthermore, devices 10 having no display may benefit from the present techniques, as the size savings of the device 10 would not be constrained by the size of a display. For example, devices 10 such as the iPod Shuffle® may benefit from the present techniques, as the iPod Shuffle® may have a substantial portion of test points on the PCB devoted to functional testing. Additionally, it should be understood that the techniques described herein may be implemented using any type of suitable electronic device, including less portable electronic devices, such as a personal desktop computer, or any other electronic device or system which may include a power management unit.

In the depicted embodiment, the device 10 includes an enclosure 12 that protects the interior components from physical damage and shields them from electromagnetic interference. The enclosure 12 may be formed from any suitable material such as plastic, metal or a composite material and may allow certain frequencies of electromagnetic radiation to pass through to wireless communication circuitry within the device 10 to facilitate wireless communication.

The enclosure 12 may further provide for access to various user input structures 14, 16, 18, 20, and 22, each being configured to control one or more respective device functions when pressed or actuated. By way of the user input structures, a user may interface with the device 10. For instance, the input structure 14 may include a button that when pressed or actuated causes a home screen or menu to be displayed on the device. The input structure 16 may include a button for toggling the device 10 between one or more modes of operation, such as a sleep mode, a wake mode, or a powered on/off mode. The input structure 18 may include a dual-position sliding structure that may mute or silence a ringer in embodiments where the device 10 includes cell phone functionality. Further, the input structures 20 and 22 may include buttons for increasing and decreasing the volume output of the device 10. It should be understood that the illustrated input structures 14, 16, 18, 20, and 22 are merely exemplary, and that the electronic device 10 may include any number of user input structures existing in various forms including buttons, switches, control pads, keys, knobs, scroll wheels, and so forth, depending on specific implementation requirements.

The device 10 further includes a display 24 configured to display various images generated by the device 10. The display 24 may also display various system indicators 26 that provide feedback to a user, such as power status, signal strength, call status, external device connections, or the like. The display 24 may be any type of display such as a liquid crystal display (LCD), a light emitting diode (LED) display, an organic light emitting diode (OLED) display, or other suitable display. Additionally, in certain embodiments of the electronic device 8, the display 10 may include a touch-sensitive element, such as a touch screen interface.

As further shown in the present embodiment, the display 24 may be configured to display a graphical user interface ("GUI") 28 that allows a user to interact with the device 10. The GUI 28 may include various graphical layers, windows, screens, templates, elements, or other components that may be displayed on all or a portion of the display 24. For instance, the GUI 28 may display a plurality of graphical elements, shown here as a plurality of icons 30. By default, such as when the device 10 is first powered on, the GUI 28 may be configured to display the illustrated icons 30 as a "home screen," referred to by the reference numeral 29. In certain embodiments, the user input structures 14, 16, 18, 20, and 22, may be used to navigate through the GUI 28 and (e.g., away from the home screen 29). For example, one or more of the user input structures may include a wheel structure that may allow a user to select various icons 30 displayed by the GUI 28. Additionally, the icons 30 may also be selected via the touch screen interface.

The icons 30 may represent various layers, windows, screens, templates, elements, or other graphical components that may be displayed in some or all of the areas of the display 24 upon selection by the user. Furthermore, the selection of an icon 30 may lead to or initiate a hierarchical screen navigation process. For instance, the selection of an icon 30 may cause the display 24 to display another screen that includes one or more additional icons 30 or other GUI elements. As will be appreciated, the GUI 28 may have various components arranged in hierarchical and/or non-hierarchical structures.

In the present embodiment, each icon 30 may be associated with a corresponding textual indicator 32, which may be displayed on or near its respective icon 30. For example, the icon 34 may represent a media player application, such as the iPod® or iTunes® application available from Apple Inc. The icon 35 may represent an application providing the user an interface to an online digital media content provider. By way of the example, the digital media content provider may be an online service providing various downloadable digital media content, including primary (e.g., non-enhanced) or enhanced media items, such as music files, audiobooks, or podcasts, as well as video files, software applications, programs, video games, or the like, all of which may be purchased by a user of the device 10 and subsequently downloaded to the device 10. In one implementation, the online digital media provider may be the iTunes® digital media service offered by Apple Inc.

The electronic device 10 may also include various input/output (I/O) ports, such as the illustrated I/O ports 36, 38, and 40. These I/O ports may allow a user to connect the device 10 to or interface the device 10 with one or more external devices and may be implemented using any suitable interface type such as a universal serial bus (USB) port, serial connection port, FireWire port (IEEE-1394), or AC/DC power connection port. For example, the input/output port 36 may include a proprietary connection port for transmitting and receiving data files, such as media files. The input/output port 38 may include a connection slot for receiving a subscriber identify module (SIM) card, for instance, where the device 10 includes cell phone functionality. The input/output port 40 may be an audio jack that provides for connection of audio headphones or speakers. As will appreciated, the device 10 may include any number of input/output ports configured to connect to a variety of external devices, such as to a power source, a printer, and a computer, or an external storage device, just to name a few.

Certain I/O ports may be configured to provide for more than one function. For instance, in one embodiment, the I/O port 36 may be configured to not only transmit and receive data files, as described above, but may be further configured to couple the device to a power charging interface, such as an power adaptor designed to provide power from a electrical wall outlet, or an interface cable configured to draw power from another electrical device, such as a desktop computer. Thus, the I/O port 36 may be configured to function dually as both a data transfer port and an AC/DC power connection port depending, for example, on the external component being coupled to the device 10 via the I/O port 36.

The device 10 may include a PMU which may control the supply of power to different units in the device 10. As discussed, the PMU may be capable of self-testing, such that some test points typically required to conduct functional tests may be eliminated from the PCB. The functional testing may test the power supply outputs of the device 10 by measuring, for example, the capacitance and/or voltage at each power supply output on the PMU. Taking capacitance and voltage measurements during a PMU self-test may be referred to as a "capacitance test" or a "voltage test," and may involve the comparison of capacitance and voltage measurements with expected values. The capacitance test may be based on an external line capacitance at each power supply output, and may determine whether all power supply outputs of a PMU are properly connected to the PCB of the device 10. The voltage test may determine whether each power supply output is supplying a proper voltage through the power rails, and may confirm the proper connection of the PMU to the PCB of the device 10.

Figure 2:
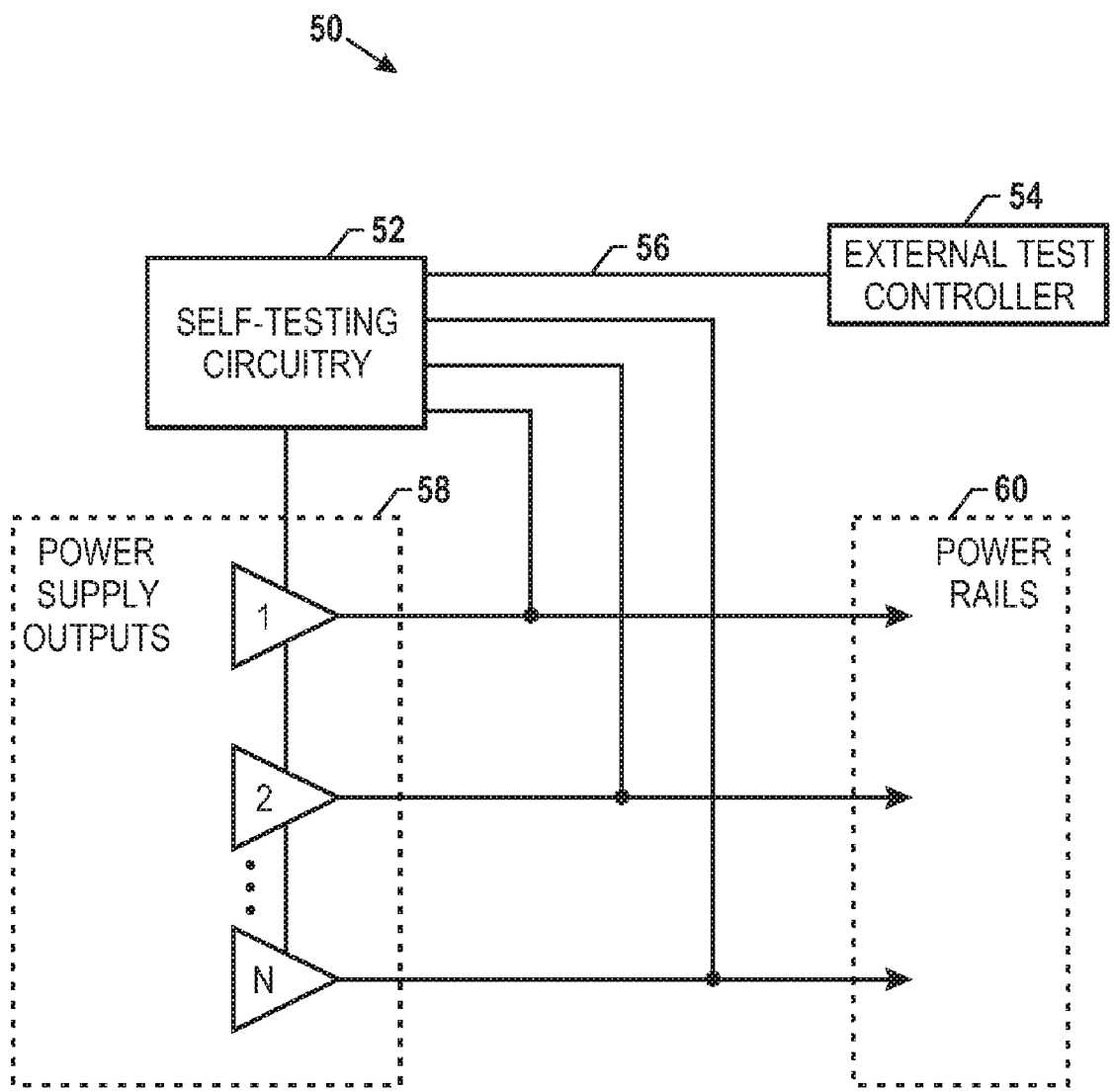
FIG. 2 is a schematic diagram of a portion of a power management unit (PMU) configured to conduct self-testing, in accordance with one embodiment of the present techniques.
Figure 3:
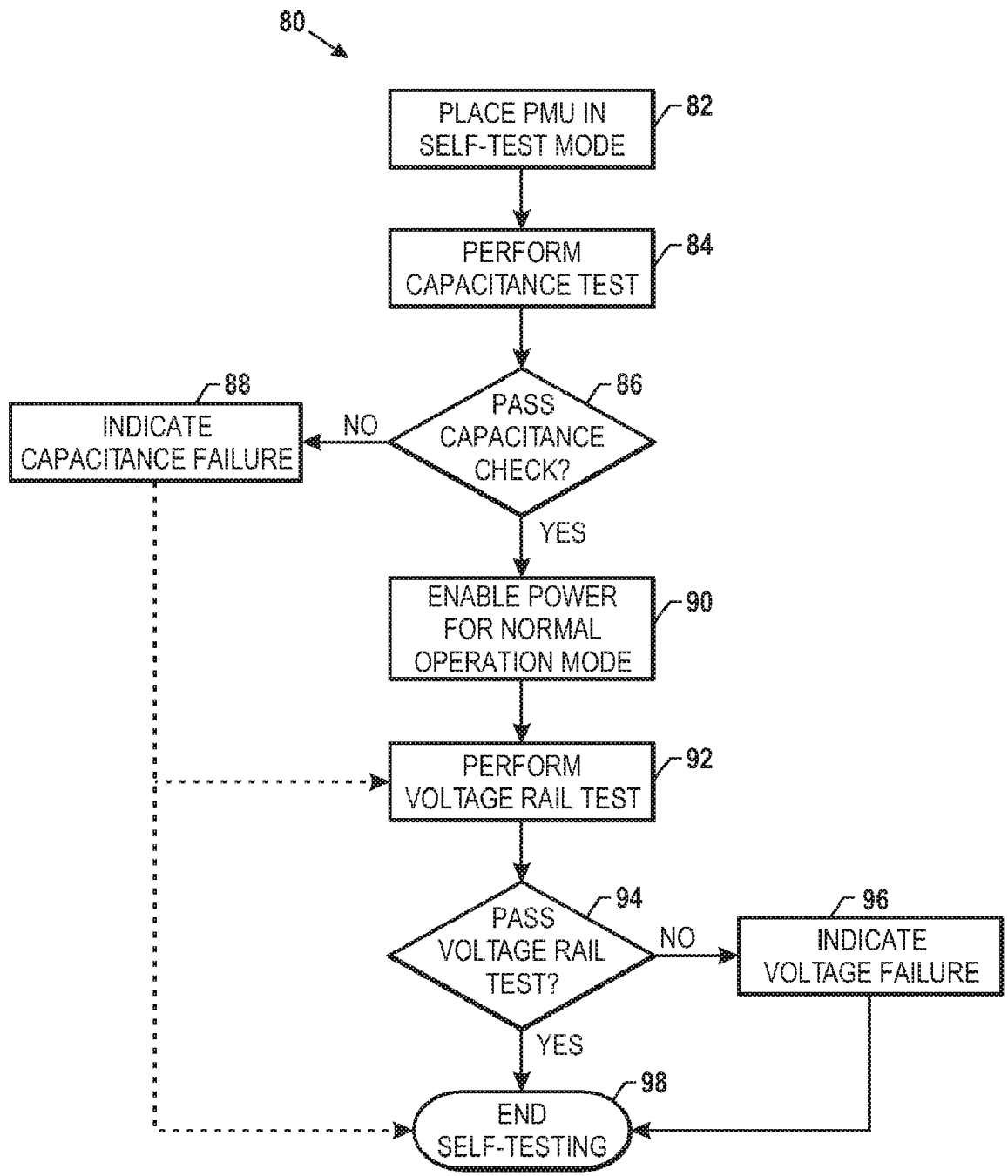
FIG. 3. is a flow chart of a general process for the self-testing of the PMU, in accordance with one embodiment of the present techniques.

A schematic diagram generally depicting a portion of an integrated circuit 50 on a self-testing PMU is presented in FIG. 2. Further, an overview of a self-test process 80 in accordance with embodiments of the present techniques is provided in the flow chart of FIG. 3. The schematic diagram of FIG. 2 illustrates components which may be involved in the self-test process 80 of FIG. 3, and FIGS. 2 and 3 may be explained concurrently.

To initiate the self-test process 80, the self-testing circuitry 52 may first place the PMU in self-test mode (block 82). The self-testing circuitry 52 may include components, such as a processor or controller, used to conduct or control the self-test. The components may be internal to the PMU, and referred to as an "internal test controller" (not shown). The PMU may also initiate self-test mode (block 82) based on instructions from an external test controller 54, which may communicate with the self-testing circuitry 52 through a control interface 56. Likewise, the self-testing circuitry 52 may communicate results of the self-test to the external test controller 54, or to any other element external to the PMU, such that the results may be indicated externally.

Self-test mode may refer to a state where the power supply outputs 58 controlled by the PMU are disabled while some components of the PMU, including internal resources such as control registers, analog-to-digital converters, or voltage references, remain operational. Once in self-test mode, the self-testing circuitry 52 may perform a capacitance test on the power supply outputs 58 (block 84). The capacitance test may indicate certain conditions of the power supply outputs 58. For example, the pin of one power supply output may be not soldered correctly to the PCB, creating an open circuit between the PMU pin and the PCB. Alternatively, the pin of one power supply output may be connected to ground, or to another power supply output, creating a short circuit in the PMU. The self-testing circuitry 52 may determine whether the power supply outputs 58 pass the capacitance test (block 86). If the self-testing circuitry 52 determines that the results of the capacitance test indicate a failure in one of the power supply outputs 58, this result may be indicated (block 88). The PMU self-test process 80 may either end (block 98) if a capacitance failure is indicated (block 88), or the self-test process 80 may continue despite capacitance failures. Alternatively, the self-test process 80 may continue if the capacitance failure does not occur on power supply outputs 58 significant to normal operating mode.

After the capacitance testing portion of the self-test process 80, the self-testing circuitry 52 may start the PMU in normal operating mode (block 90) to enable the self-testing circuitry 52 to perform a voltage test (block 92) by measuring the voltage at the PMU power supply outputs 58. Normal operating mode may refer to a state where the power supply outputs 58 are turned on, enabling the self-testing circuitry 52 to selectively measure the voltage at the rails 60 of the power supply outputs 58 during the voltage test (block 92). As the rails 60 may return analog currents, the measurements at the rails 60 may be converted to digital voltage measurements suitable for the external test controller 54 or the internal test controller in the self-testing circuitry 52. In one embodiment, the self-testing circuitry 52 may include an analog-to-digital converter (ADC) to convert the analog measurements into digital measurements. The self-testing circuitry 52 may then determine whether the PMU power supply outputs 58 pass the voltage test (block 94). If any of the power supply outputs 58 fail, the self-testing circuitry 52 may indicate the failure(s) (block 96). After the self-testing circuitry 52 determines that all power supply outputs 58 pass the voltage rail test, or after any voltage failures are indicated, the self-test process 80 may end (block 98).

Figure 4:
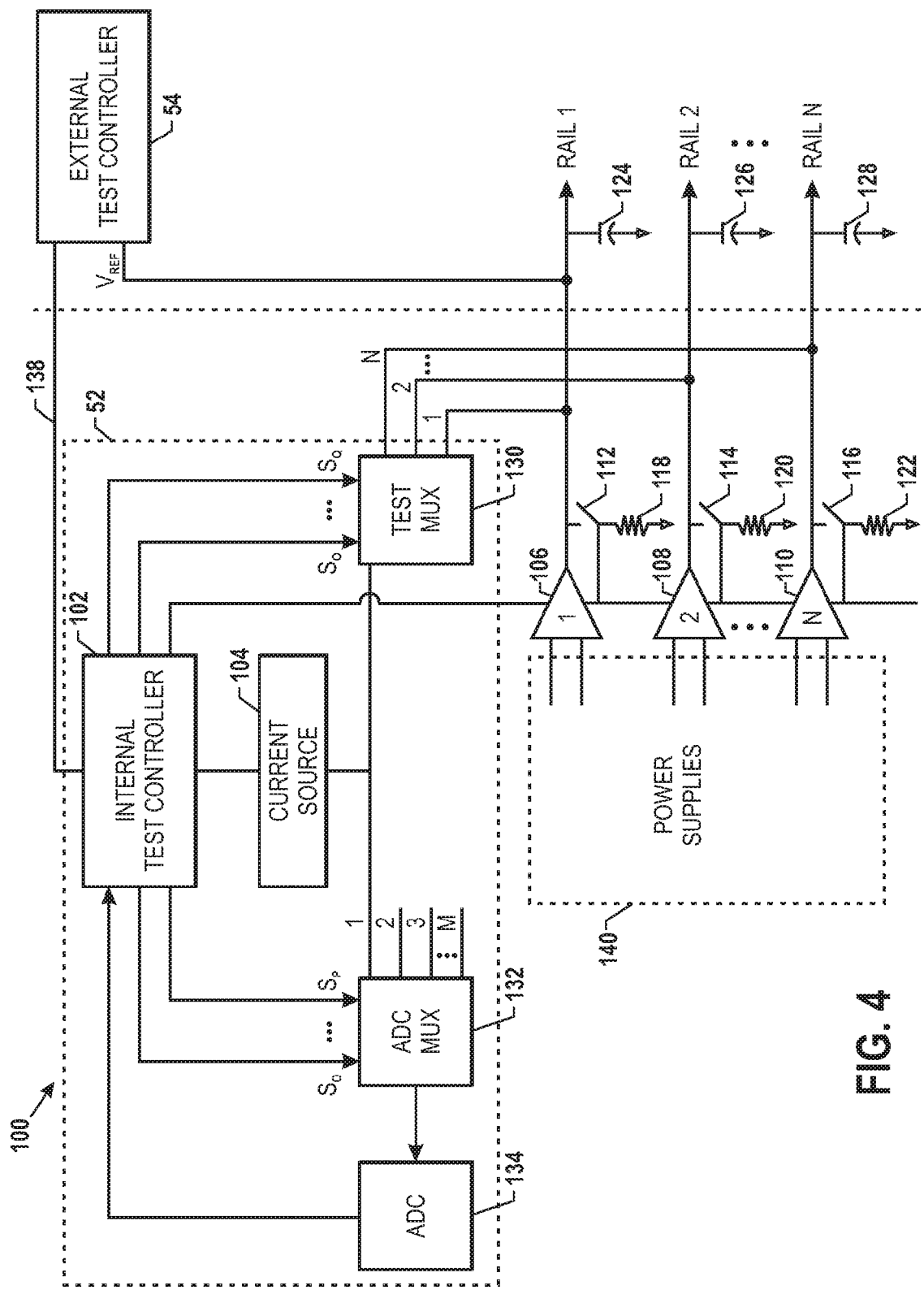
FIG. 4 is a schematic diagram of an integrated circuit configured to enable self-testing of the PMU, in accordance with one embodiment of the present techniques.
Figure 5:
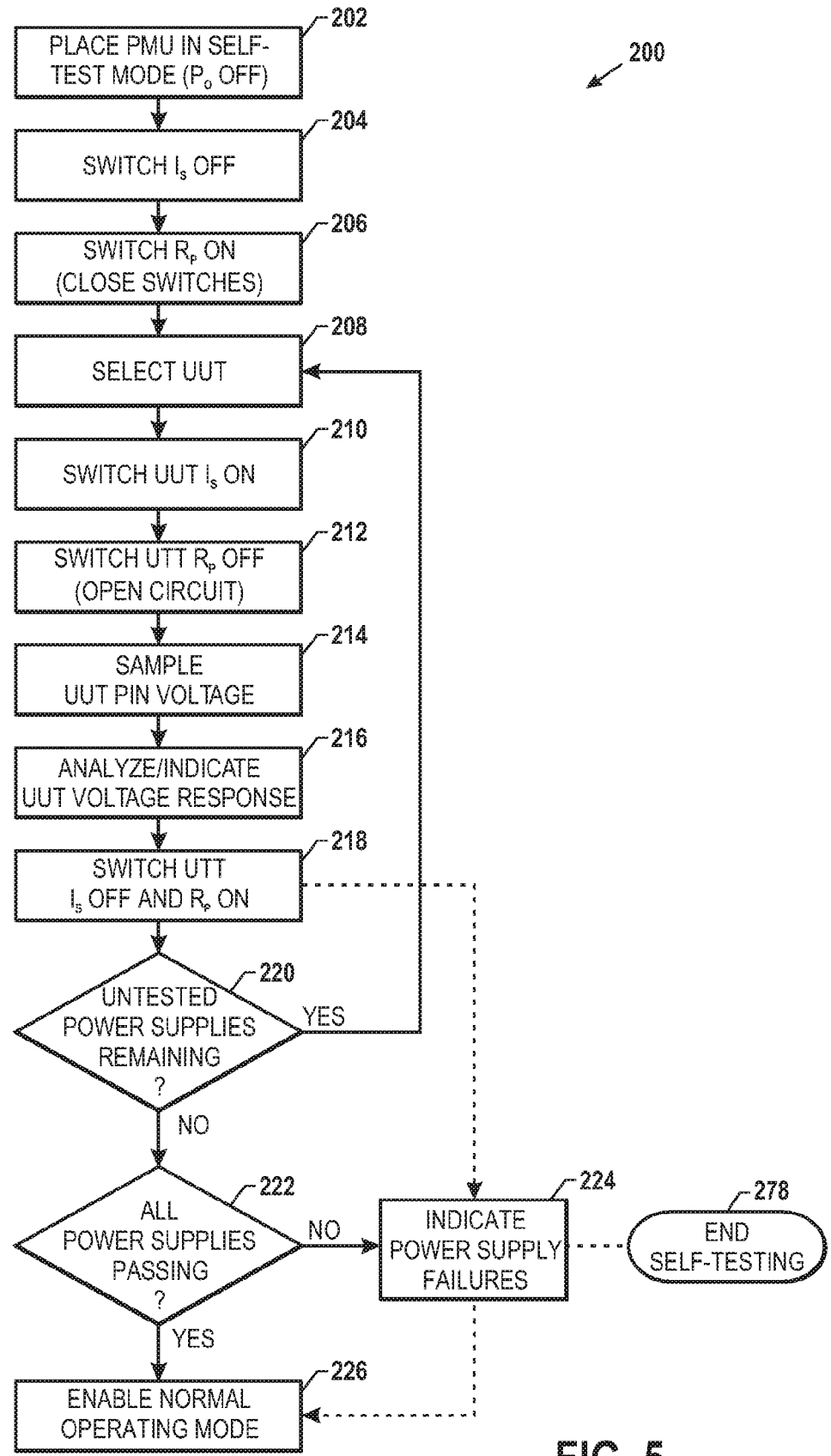
FIG. 5 is a flow chart of a process for testing the capacitance at the PMU power supply outputs, in accordance with embodiments of the present techniques.
Figure 6:
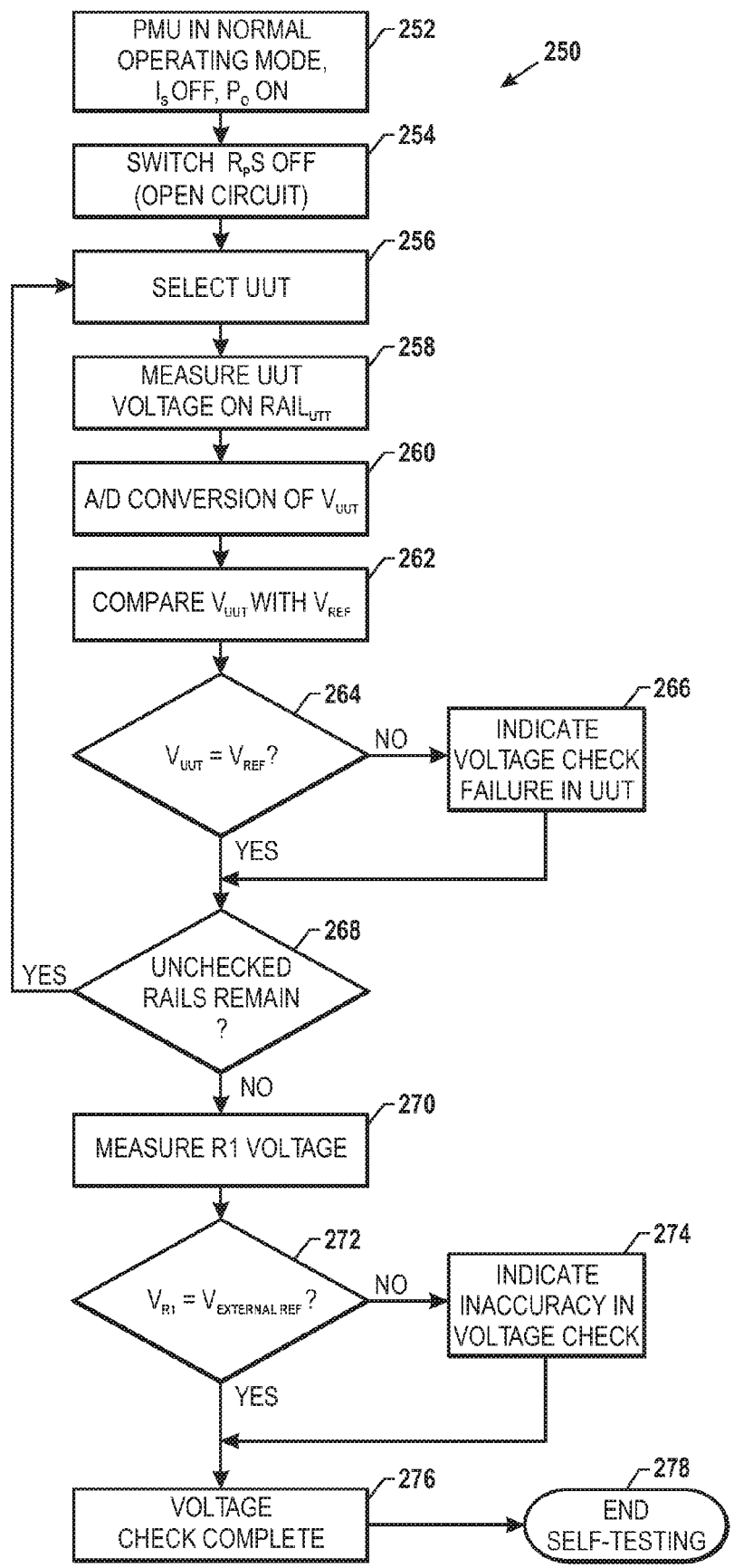
FIG. 6 is a flow chart of a process for testing the voltage at the PMU power rails, in accordance with embodiments of the present techniques.

A more detailed explanation of one embodiment of the present techniques is provided in FIGS. 4-6. FIG. 4 is a schematic diagram of a portion of an integrated circuit 100 on a PMU that includes a self-testing circuit 52 (as in FIG. 2) and is capable of self-testing. The integrated circuit 100 may be a more detailed depiction of the integrated circuit 50 of FIG. 2. The self-testing circuit 52 may self-test the capacitance on each power supply output (blocks 84, 86, and 88, as in FIG. 3), and this process is depicted in the flow chart of FIG. 5. Further, the self-testing circuit 52 may self-test the voltage on each power supply (blocks 92, 94, and 96, FIG. 3), which is explained in the flow chart of FIG. 6. As each of FIGS. 5 and 6 explain detailed parts of the self-test process 80 (FIG. 3), and as the schematic diagram of FIG. 4 illustrates components which may be involved in the self-test process 80, FIGS. 4-6 may be explained concurrently.

In FIGS. 4-6, the self-testing circuit 52 may include an internal test controller 102, which may substantially control the self-tests of the PMU, such as the capacitance test 200 and the voltage test 250. In embodiments of the present techniques, an external test controller 54 may also control certain parts of the self-tests 200 and 250. As will be discussed, the involvement of the internal test controller 102 and the external test controller 54 may depend on one or more factors, such as the reason for conducting a self-test, the level of detail required from self-test results, or the type of indication needed to communicate self-test results. Further, the external test controller 54 may communicate with the internal test controller 102 through an interface 138, which may include an inter-integrated circuit or bus. For example, in some embodiments, the external test controller 54 may control some functions of the internal test controller 102 during self-testing, or the internal test controller 102 may send data from the self-tests to the external test controller 138 for diagnoses or retrieval by a user.

Referring now to FIGS. 4 and 5, the internal test controller 102 may begin the capacitance test 200 by placing the PMU in self-test mode (block 202). In the self-test mode, the power supplies 140 to the power supply outputs 106, 108, and 110 may be disabled while the PMU core (including internal resources, such as control registers, analog-to-digital converters, or voltage references) may remain powered. As the power supplies 140 are off for all the outputs 106, 108, and 110, the internal test controller 102 may selectively measure the capacitance at each of the power supply outputs 106, 108, and 110 by supplying current through a current source 104 and distributing the current to only the selected output 106, 108, or 110 through a selection circuit such as, for example, a test multiplexer 130. Of course, any technique suitable for selecting each power supply output 106, 108, or 110 may be used. Alternatively, multiple current sources and ADCs may be used to concurrently perform these measurements without the use of a selection circuit.

Before taking capacitance measurements, the internal test controller 102 may first switch the current source 104 off for all the power supply outputs 106, 108, and 110 (block 204). The internal test controller 102 may also switch on the pulldown resistors 118, 120, and 122 by closing the switches 112, 114, and 116 of all the power supply outputs 106, 108, and 110 (block 206). By closing the switches 112, 114, and 116, any current flowing through the power supply outputs 106, 108, and 110 may be drawn to ground with a relatively low resistance (approximately less than 500 ohms) when the outputs 106, 108, and 110 are not being tested. This further enables the internal test controller 102 to test the connection of a power supply output 106, 108, or 110 by opening its corresponding switch 112, 114, or 116 and measuring its external line capacitance. The external line capacitance of the power supply outputs 106, 108, and 110 may refer to an inherent capacitance in the rail (e.g., a line, a wire, a pin, or some other conductive connection) between the power supply outputs 106, 108, and 110 and the PCB of the device 10, and may determine whether the rail of each power supply output 106, 108, or 110 has been properly soldered or connected to the PCB. The external line capacitance may be depicted in FIG. 4 as capacitors, and may be referred to as capacitances 124, 126, and 128.

The internal test controller 102 may then select a power supply output 106, 108, or 110 for capacitance testing (block 208), and the selected power supply output 106, 108, or 110 may be referred to as the "unit under test" (UUT). The power supply outputs 106, 108, and 110, marked 1, 2, and n, are each coupled to the corresponding rails 1, 2, and n. While only three power supply outputs and three rails are depicted, as indicated by the output and rail marked "n," a PMU may include any number of power supply outputs and may supply power through the rails to any number of components in the device 10. To select the UUT, the internal test controller 102 may communicate with the test multiplexer 130 through select bits $S_0$-$S_q$. The test multiplexer 130 may provide a current path between the current source 104 and the UUT, and the internal test controller may switch on the current source 104 to provide current to the UUT (block 210). The pulldown resistor of the UUT may be switched off (block 212), such current will not be pulled down by the pulldown resistor, and will flow through the rail of the UUT, charging a line capacitance in the UUT rail.

For example, if the first power supply output 106 is the UUT, the switch 112, which was previously closed when the self-test mode was initiated (block 202), may be opened (block 212), so that current flows through the rail 1 of the UUT 106. The voltage at the rail of the UUT 106 may be sampled (block 214), and the internal test controller 102 may analyze the voltage response of the UUT 106 (block 216).

As discussed, the analog measurement at the UUT 106 may be converted to a digital voltage measurement suitable for the internal test controller 102. The analog measurement may first be sent to an ADC 134 to obtain a digital voltage measurement from the rail of the UUT 106. In some embodiments, an ADC multiplexer 132 may be coupled to the ADC 134. The ADC multiplexer 132 may also be coupled to various other outputs on the PMU, and the internal test controller 102 may connect the measurements from the power supply outputs 106, 108, and 110 to an ADC 134 through select bits $S_0$-$S_p$ of the ADC multiplexer 132.

The capacitance test process 200 measures the voltage response at the UUT 106 to determine the effect of the external line capacitance 124 of the rail of the UUT 106, and this voltage response may also be referred to as the "capacitance measurement." The capacitance measurement of the UUT 106 may be analyzed to determine whether the rail of the UUT 106 has been properly soldered or connected to the PCB. Since the properties of the rails of the power supply outputs 106, 108, and 110 may be known, a properly connected power supply output 106, 108, or 110 may have an expected capacitance measurement. The comparison of the capacitance measurement to an expected capacitance measurement may determine whether the output 106, 108, or 110 is properly connected. For example, the internal test controller 102, or the external test controller 54, may have access to capacitance measurement references, and if a capacitance measurement from a power supply output 106, 108, or 110 is not substantially similar to the corresponding reference, the test controller 102 or 54 may determine that a power supply output 106, 108, or 110 of the PMU is improperly connected. The references may be stored in one or more memory locations accessible to the test controllers 102 or 54. In one embodiment, the internal test controller 102 may access registers within the PMU and determine whether the power supply outputs 106, 108, and 110 pass or fail the capacitance test. In some embodiments, the internal test controller 102 may transfer capacitance test results to the external test controller 54, which may provide diagnoses on likely causes of capacitance test failures in power supply outputs 106, 108, or 110 which fail the capacitance test.

The capacitance measurement at the UUT 106 may indicate various conditions. For example, a 200 µA current may be supplied to a UUT 106 having an expected external line capacitance 124 of 1 µF at the rail of the UUT 106. In this example, if the voltage at the UUT 106 rises quickly (e.g., less than about 2 ms) from 0V to the supply voltage, this may indicate that the PMU pin at rail 1 of the UUT 106 is open. One explanation for this may be that the PMU pin is not correctly soldered to the PCB, and the external line capacitance 124 of the UUT 106 is not being charged. If the voltage at the rail of UUT 106 remains low (e.g., less than about 200 mV) for an extended period of time (e.g., greater than about 20 ms), this may indicate that the PMU pin at rail 1 of the UUT 106 is shorted to ground with low resistance (e.g., less than about 500 ohms), or is shorted to another PMU supply output which has a pulldown resistor 120 or 122 switched on. If the voltage slowly rises (e.g., about 10-20 ms rise time) and eventually stabilizes at a voltage in a given range, such as between the supply voltage and approximately 0.5V, this may indicate that the rail 1 of the UUT 106 is correctly connected, as the internal test controller 102 has received a correct measurement of external line capacitance 124 and supply loading on the PCB.

The current, capacitance, time, voltage, and resistance values discussed herein are merely examples based on one embodiment of the present techniques, and may provide a reference for a relationship between capacitance measurements occurring under different conditions. For example, the voltage at an open pin may generally rise more quickly than a properly connected pin, which may rise more quickly than a shorted pin. A person of ordinary skill in the art will recognize that depending on the circuit design, and depending on various other conditions in accordance with the present techniques, different ranges or values may be used.

The UUT may be held in the capacitance testing state for a period of time in which the internal test controller 102 may analyze the voltage response. This period of time may depend on the levels of capacitances 124, 126, and 128 in the rails of the power supply outputs 106, 108, and 110, or on the level of current supplied by the current source 104. Furthermore, multiple tests supplying different levels of current may be conducted on a UUT to obtain different voltage measurements. Supplying different levels of current during the capacitance test 200 may provide more details or more information about the status of a power supply outputs 106, 108, and 110. For example, running multiple tests with different levels of current may provide a level of detail to enable the determination of whether an output 106, 108, or 110 is shorted to ground, or shorted to another output 106, 108, or 110.

Because conducting multiple tests on a UUT may take more time, the internal test controller 102 may conduct one test, or more than one test on a UUT, depending on time constraints for the capacitance test 200. Different designs of the circuit 100 may also enable concurrent testing of different power supply outputs 106, 108, and 110. In one embodiment, more than one test multiplexer 130 may enable the internal test controller 102 to supply current to more than one power supply output 106, 108, or 110. This may reduce the time needed for self-testing, or may allow for multiple tests with different levels of supplied current.

Once the internal test controller 102 has retrieved a capacitance measurement from the UUT (block 216), the UUT supply current may be switched off, and the pulldown resistor may be switched on (block 218). The internal test controller 102 may then determine whether untested power supply outputs 106, 108, and 110 remain (block 220). If untested power supply outputs 106, 108, and 110 remain, then the internal test controller 102 may then select another unit for capacitance testing (block 208). Once all the power supply outputs 106, 108, and 110 have been tested, the internal test controller 102 may determine whether all outputs 106, 108, and 110 have passed the capacitance test and may indicate which outputs 106, 108, and 110, if any, have failed the capacitance test (block 224).

The internal test controller 102 may provide the failure indication to another element of the PMU, or to an element external to the PMU. For example, the internal test controller 102 may communicate with the external test controller 54 that a particular power supply output 106, 108, or 110 has failed the capacitance test. The failure indication may result in some external indication, such as a light or a display. The failure indication 224 may also be made when the internal test controller 102 first analyzes the UUT voltage response (block 216), or at any time during the capacitance test process 200. Furthermore, the failure indication may include a diagnosis of the capacitance test results and the probable cause of abnormal voltage measurements. For example, the internal test controller 102 may indicate that the power supply output 106, 108, or 110 may be open and not properly soldered to the circuit board, or that one output 106, 108, or 110 is shorted to another output 106, 108, or 110 or to ground. The diagnosis of the capacitance test results may also result in some external indication. Depending on the type of external indication desired, the external test controller 54, or some other suitable external testing device, may use a light, a display, or some type of output signal, to indicate that a power supply output 106, 108, or 110 is improperly connected.

In one embodiment, the capacitance measurements returned from the capacitance test process 200 may be stored in a register (not shown) in the internal test controller 102. The capacitance measurements may be accessible from the register by the internal test controller 102 or the external test controller 54 to determine the status of the PMU power supply outputs 106, 108, and 110. The capacitance measurements may be stored in a pass or fail form, where a pass may be entered for a power supply output 106, 108, or 110 that passes the capacitance test 200. The capacitance measurements may also be stored as values to enable further testing (e.g., troubleshooting, if a PMU power supply fails the self-test) to determine likely types or causes of the power supply output failures. Capacitance measurement data may also be stored in external components, such as in the external test controller 54, and may be transferred to external components through a control interface 138. For example, a control interface 138 may include an inter-integrated circuit or bus allowing data transfer between the integrated circuit 100 on the PMU and an external element of the electronic device 10.

If the internal test controller 102 determines that all the power supply outputs 106, 108, and 110 has an acceptable capacitance measurement under the testing parameters of the capacitance test 200, the PMU may enter normal operating mode (block 226), and the power supply outputs 106, 108, and 110 may be enabled. As the power supply outputs 106, 108, and 110 may now output power from the power supplies 140, the internal test controller 102 may conduct a voltage test 250 by measuring the voltage at the rail of each power supply output 106, 108, or 110 to determine whether it is properly outputting voltage through its rail to power a unit of the device 10.

In one embodiment, the normal operating mode may be enabled (block 226) when all power supply outputs 106, 108, and 110 have been measured, even if one or more power supply outputs have failed the capacitance test 200. In another embodiment, the self-test may end (block 278) after a capacitance test failure under certain situations. For example, the internal test controller 102 may not proceed to enable normal operating mode (block 226), if a power supply output 106, 108, and 110 that is significant to normal operating mode does not return an acceptable capacitance measurement during the capacitance test process 200.

Assuming that all power supply outputs 106, 108, and 110 returned an acceptable voltage measurement (e.g., the voltage slowly rose and stabilized, signifying the correct connection of the PMU pin to the PCB), the PMU may pass the capacitance test process 200 to enter the voltage test process 250 of the self-test, as depicted in FIG. 6. At the start of the voltage test process 250, the PMU may be in normal operating mode (block 252). In the normal mode, the power supply outputs 106, 108, and 110 may be enabled while the current source 104 remains off. The internal test controller 102 may open the switches 112, 114, and 116 of the pulldown resistors 118, 120, and 122 (block 254), and the internal test controller 102 may selectively measure the voltage at each power supply output 106, 108, and 110 by turning on the power supply of a UUT, and selecting a connection from each power supply output 106, 108, and 110 to an ADC 134 through the test multiplexer 130. For example, if the first power supply output 106 is selected (block 256), the ADC 134 receives the analog current on the rail of the UUT 106 and converts the analog current to a digital voltage measurement (block 258).

In some embodiments, the signal of each power supply output 106, 108, or 110 may reach the ADC 134 by passing the test multiplexer 130 to an ADC multiplexer 132. As discussed, the ADC multiplexer 132 may be in the PMU of the device, and may have multiple inputs (2-m) for other elements in the PMU. By controlling the select bits $S_0$-$S_p$, the internal test controller 102 may enable the ADC multiplexer 132 to connect to the test multiplexer 130 when the PMU is self-test mode. Thus, the ADC multiplexer 132 may enable the signal from each power supply output 106, 108, or 110 to reach the ADC 134, where the analog voltage is converted to a digital voltage measurement (block 260). The voltage measurement may be directed to the internal test controller 102, and the voltages at each of the power supplies 106, 108, and 110 may be analyzed for accuracy. For example, the voltage measurement at each UUT may be compared with a reference voltage measurement (block 262). If the voltage measurement at a power supply 106, 108, or 110 is found to be inaccurate, then the internal test controller 102 may indicate a voltage test failure for that power supply (block 266). The voltage test process 250 may then determine whether any power supplies 106, 108, and 110 remain unchecked, and select another power supply 106, 108, or 110 for voltage measurement until all voltage measurements are taken.

In one embodiment, the accuracy of the self-test may be further confirmed by comparing a power supply output 106, 108, or 110 to an external reference voltage, in addition to the internal reference voltages to which each UUT voltage measurement is compared (block 264). For example, an external test controller 54 may connect to the first power rail 106 to measure the voltage at that rail 106 (block 270). The external test controller 54 may compare the voltage measurement of the first rail 106 with an external reference voltage to determine whether the voltage measurement of the first rail 106 is within an acceptable margin of error. If the first power rail 106 is not within an acceptable margin of error, this may indicate that either the first power rail 106 has failed the voltage check and the PMU pin of the first power supply 106 is not properly connected on the circuit board, or that the reference voltages used by the internal test controller 102 has inaccurately deemed the first rail 106 to pass the voltage check. Thus, the comparison of the first power rail 106 voltage with the external voltage reference may confirm proper testing by the internal test controller 102. For example, if the internal test controller 102 determines that first power rail 106 returns an acceptable voltage measurement based on some internal voltage reference, but the external test controller 54 determines that the first power rail 106 returns an unacceptable voltage measurement based on an external voltage reference, then the inconsistency may indicate that the voltage references used by the internal test controller 102 are inaccurate. In this situation, the process 250 may indicate a possible inaccuracy in the voltage check process. This indication may be made to other external elements of the electronic device, and may enable a user or a tester to address the problem.

In other embodiments, the previously discussed voltage check confirmation (blocks 270 and 272) may also be completed through other methods in accordance with the present techniques. For example, the ADC 134 voltage measurement for any of the power supply outputs 106, 108, or 110 may be compared to a voltage reference. The voltage reference may be accessed from a register in the PMU, or from any external register in the electronic device 10.

If the internal test controller 102 completes the testing of each power supply output 106, 108, and 110, and the voltage test confirmation (blocks 270 and 272) determines that the internal test controller 102 is properly functioning, the voltage check may be complete (block 276). This may conclude the PMU self-test (block 278).

While the embodiments described with reference to FIGS. 5 and 6 explain a PMU self-test process where the internal test controller 102 (as in FIG. 4) substantially controls the self-test processes 200 and 250, control over the self-test processes 200 and 250 is not limited to the internal test controller 102. As previously discussed, the ADC 134 may send the capacitance and/or voltage measurements to the internal test controller 102, which may send the measurements through a control interface 138 to the external test controller 54. In some embodiments, the ADC may send the capacitance and/or voltage measurements directly to an external test controller 54. Once the external test controller 54 receives the measurements, the external test controller 54 may determine whether each of the power supply outputs 106, 108, and 110 passes the self-test. In one embodiment, the self-test measurements may be stored in registers external to the PMU. The measurements may be accessible from the registers by either the external test controller 54 or the internal test controller 102, and may be stored such that the measurements for each output 106, 108, or 110 may be retrieved.

The self-testing of the present techniques may be conducted on a PMU at any point during or after the manufacturing of the electronic device containing the PMU. Tests performed during manufacturing of the electronic device may ensure that the PMU is properly connected to the circuit board of the device. Further, self-testing may be initiated after manufacturing of the device. For example, routine servicing or diagnostic testing of the device may require testing of the PMU power supplies. In such situations, self-testing may be initiated externally, and the external test controller 54 and/or some external diagnostic device may be used to communicate with the internal test controller 102 of the PMU. In some embodiments, the self-test, or some portion of the self-test, may be conducted whenever a device is powered on. As discussed, the results of such self-tests may be stored in memory registers, and such data may be available for later testing.

A self-testing PMU in accordance with the present techniques may eliminate a significant number of testing points which may otherwise be required to enable functional testing of the device. For example, a PCB in a device 10 may have 18 test points, where 14 of the 18 test points may generally be devoted to power supply testing. The self-testing PMU of the present techniques may eliminate 12 of the 14 test points, such that only 6 test points remain. As test points generally require approximately 1 mm² to about 2 mm², such as about 1.6 mm², on the circuit board, approximately 12 mm² to about 24 mm² of the PCB area may be saved in this example. In embodiments, the reduction of the number of test points and the resulting savings in the PCB area may vary depending on other factors or specifications of the device. Furthermore, as test controller circuitry may require comparatively less space than numerous test points, functional testing of the PMU may be accomplished on a smaller PCB or circuit board.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A power management unit (PMU), comprising:
   at least one power supply having at least one power supply output;
   a test controller configured to control a state of the at least one power supply to cause the at least one power supply to turn on and off, the test controller configured to determine a voltage associated with the at least one power supply output when the at least one power supply is on; and
   a current source configured to deliver a current to the at least one power supply output when the at least one power supply is off, wherein the test controller is configured to monitor a signal produced by the current on the at least one power supply output to determine a parameter correlative to a capacitance associated with the at least one power supply output.

2. The PMU of claim 1, comprising an analog-to-digital converter (ADC) configured to convert an analog signal from the at least one power supply output to a digital signal and to deliver the digital signal to the test controller.

3. The PMU of claim 1, wherein the test controller is configured to control the current source.

4. The PMU of claim 3, wherein the current source is configured to supply different currents to the at least one power supply output, and wherein the test controller is configured to monitor different signals produced by the different currents to determine different parameters correlated to a capacitance associated with the at least one power supply output.

5. The PMU of claim 1, wherein the at least one power supply output is coupled to ground via a switch and a resistor, and wherein the test controller is configured to open and close the switch.

6. The PMU of claim 5, wherein the test controller is configured to open the switch prior to delivering the current to the at least one power supply.

7. The PMU of claim 5, wherein the test controller is configured to open the switch prior to determining the voltage associated with the at least one power supply output.

8. An electronic device, comprising:
   a power management unit (PMU) comprising:
     a plurality of power supplies, each of the plurality of power supplies having a respective power supply output;
     a test controller configured to control a state of each of the plurality of power supplies to cause the plurality of power supplies to turn on and off;
     a selection circuit operatively coupled to the test controller and configured to access a respective one of the plurality of power supply outputs based on a respective selection command from the test controller, the test controller configured to determine a voltage associated with the selected one of the plurality of power supply outputs when the plurality of power supplies are on; and
     a current source configured to deliver current to the selected one of the plurality of power supply outputs when the plurality of power supplies are off, wherein the test controller is configured to monitor a signal produced by the current on the selected one of the plurality of power supply outputs to determine a parameter correlative to a capacitance associated with the selected one of the plurality of power supply outputs.

9. The device of claim 8, wherein the parameter comprises a voltage change in the selected one of the plurality of power supply outputs over a period of time, wherein the period of time is determined by the test controller.

10. The device of claim 8, wherein the test controller is configured to indicate at least one of an abnormal voltage or an abnormal capacitance.

11. The device of claim 10, wherein the PMU comprises a memory register, and wherein the test controller is configured to store at least one of the voltage or the parameter correlative to the capacitance in the memory register.

12. The device of claim 10, comprising a display, wherein the test controller is configured to communicate with the display to indicate at least one of an abnormal voltage or an abnormal capacitance.

13. The device of claim 8, wherein the test controller is configured to compare the voltage associated with the selected one of the plurality of power supply outputs with a corresponding reference voltage to determine whether the voltage is indicative of a properly functioning power supply.

14. The device of claim 8, comprising an external test controller configured to communicate with the test controller.

15. The device of claim 8, wherein the PMU comprises an analog-to-digital converter (ADC) configured to convert analog signals from each selected power supply output to a digital signal and to deliver the digital signal to the test controller.

16. The device of claim 8, wherein the selection circuit comprises a multiplexer.

17. The device of claim 8, wherein the current source is configured to supply different currents to the selected one of the plurality of power supply outputs, and wherein the test controller is configured to monitor different signals produced by the different currents to determine different parameters correlated to a capacitance associated with the selected one of the plurality of power supply outputs.

18. The device of claim 8, wherein the selected one of the plurality of power supply outputs is coupled to ground via a switch and a resistor, and wherein the test controller is configured to open and close the switch.

19. The device of claim 18, wherein the test controller is configured to open the switch prior to delivering the current to the selected one of the plurality of power supply outputs.

20. The device of claim 18, wherein the test controller is configured to open the switch prior to determining the voltage associated with the selected one of the plurality of power supply outputs.

* * * * *